United States Patent
Jung

(10) Patent No.: US 7,259,087 B2
(45) Date of Patent: Aug. 21, 2007

(54) SEMICONDUCTOR DEVICES HAVING A VIA HOLE AND METHODS FOR FORMING A VIA HOLE IN A SEMICONDUCTOR DEVICE

(75) Inventor: Soon Wook Jung, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 182 days.

(21) Appl. No.: 10/922,756

(22) Filed: Aug. 20, 2004

(65) Prior Publication Data

US 2005/0042878 A1    Feb. 24, 2005

(30) Foreign Application Priority Data

Aug. 22, 2003    (KR) .................. 10-2003-0058157

(51) Int. Cl.
*H01L 21/4763* (2006.01)
(52) U.S. Cl. .................. 438/618; 438/622; 438/623
(58) Field of Classification Search .................. None
See application file for complete search history.

(56) References Cited

U.S. PATENT DOCUMENTS

| 4,943,539 | A | | 7/1990 | Wilson et al. |
|---|---|---|---|---|
| 5,082,801 | A | * | 1/1992 | Nagata .................. 438/640 |
| 5,457,330 | A | * | 10/1995 | Turner et al. .................. 257/188 |
| 6,133,142 | A | | 10/2000 | Tran et al. |
| 6,137,175 | A | | 10/2000 | Tabara |
| 6,232,221 | B1 | | 5/2001 | Tran et al. |
| 6,274,486 | B1 | * | 8/2001 | Rhodes et al. .................. 438/653 |
| 2003/0036227 | A1 | * | 2/2003 | Hohnsdorf .................. 438/200 |

FOREIGN PATENT DOCUMENTS

| KR | 10-1998-0028414 | 2/2000 |
|---|---|---|
| KR | 10-1999-0061966 | 7/2001 |

* cited by examiner

*Primary Examiner*—Duy-Vu N. Deo
(74) *Attorney, Agent, or Firm*—Saliwanchik, Lloyd & Saliwanchik

(57) ABSTRACT

Semiconductor devices having a via hole and methods for forming a via hole in a semiconductor device are disclosed. A disclosed method comprises performing a first etching process on an insulating layer to form a via hole, and performing a second etching process to enlarge a bottom of the via hole.

2 Claims, 4 Drawing Sheets

SEMICONDUCTOR DEVICES HAVING A VIA HOLE AND METHODS FOR FORMING A VIA HOLE IN A SEMICONDUCTOR DEVICE

FIELD OF THE DISCLOSURE

The present disclosure relates generally to semiconductor fabrication, and, more particularly, to semiconductor devices having a via hole and methods for forming a via hole in a semiconductor device.

BACKGROUND

To form a via hole in a semiconductor device, a conventional process forms an insulating layer over a metal layer. Next, a via hole is made by dry-etching the insulating layer with plasma. A TiN layer is deposited over the metal layer and used as an etch-stop layer. To remove etching-residues such as polymers on the TiN layer and residuals from the insulating layer, a predetermined portion of the TiN layer is over-etched. This also reduces electrical resistance between a metallic material to be filled into the via hole and a thin TiN layer. Next, the thin TiN layer is deposited on the inside of the via hole. Next, the metal is filled into the via hole.

FIGS. 1a through 1c are cross-sectional views illustrating a prior art process for forming a via hole in a semiconductor device. Referring to FIG. 1a, a photoresist pattern 2 for making a necessary via hole is formed on an insulating layer 1 through a photoresist development process.

Referring to FIG. 1b, a via hole 3 is formed by dry-etching the insulating layer 1 with plasma. The diameter of the upper part of the via hole 3 is larger than that of the lower part of the via hole 3. The diameter of the lower part of the via hole 3 is smaller than that of the required via hole 3.

Referring to FIG. 1c, a thin metal layer 6 is deposited on the inside of the via hole 3. Next, the via hole 3 is filled with a metallic material 7. The process for forming the via hole 3 is thus completed.

FIG. 1d is a cross-sectional view of a prior art via hole as seen through a SEM (Scanning Electron Microscope). As shown in FIG. 1d, the diameter 8 of the lower part of the via hole 3 is smaller than the diameter 9 of the upper part of the via hole 3.

Typically, prior art methods make a via hole by dry-etching an insulating layer with plasma. More specifically, the via hole for connecting metal layers is typically formed by etching the insulating layer deposited on a metal layer. However, the diameter 9 of the lower part of the via hole 3 is different from the diameter 8 of the upper part of the via hole 3 due to etching-residues such as polymers generated in the conventional etching process. As the diameter 9 of the lower part of the via hole 3 (which is in a direct contact with the bottom metal layer) is decreased, the contacting area 5 with the metal layer becomes relatively small. Thus, semiconductor devices with via holes fabricated using conventional methods suffer from problems such as current loss when power is applied.

Tran et al., U.S. Pat. No. 6,232,221, describes a method for forming borderless via holes by depositing a hard dielectric mask layer on the upper surface of a lower metal feature and forming sidewall spacers on the side surfaces of the metal feature and mask layer.

Tabara, U.S. Pat. No. 6,137,175, describes a method for fabricating a semiconductor device with multi-layer wiring.

Tran et al., U.S. Pat. No. 6,133,142, describes a method for fabricating reliable via holes by providing an adequate landing area without increasing the size of the underlying feature.

DETAILED DESCRIPTION

Figure 1A:
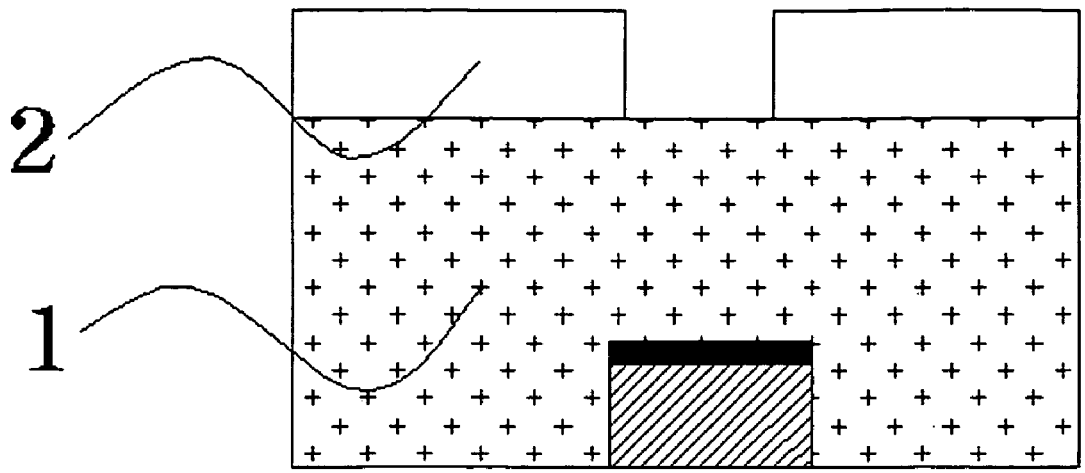
FIGS. 1a through 1c are cross-sectional views illustrating a prior art process for forming a via hole in a semiconductor device.
Figure 1B:
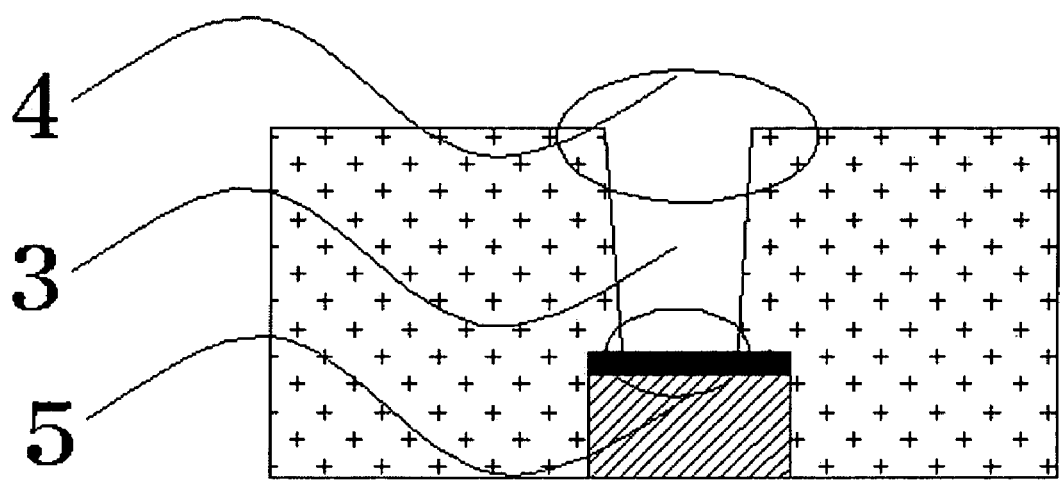
Figure 1C:
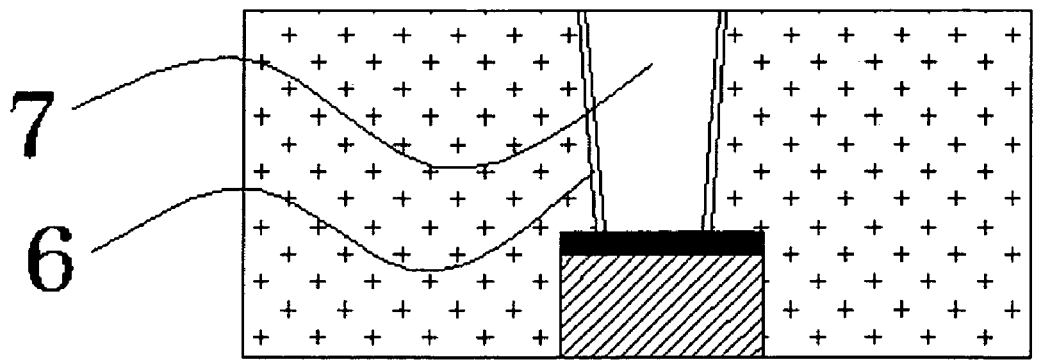
Figure 1D:
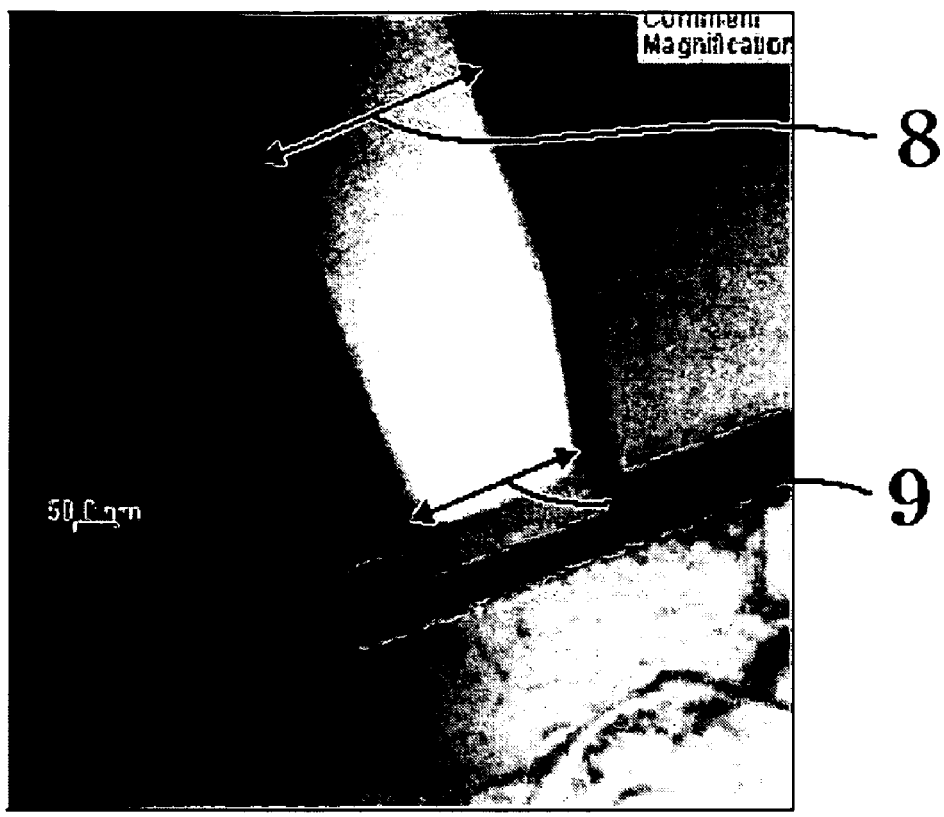
FIG. 1d is a cross-sectional view of a prior art via hole seen through a SEM (Scanning Electron Microscope).
Figure 2A:
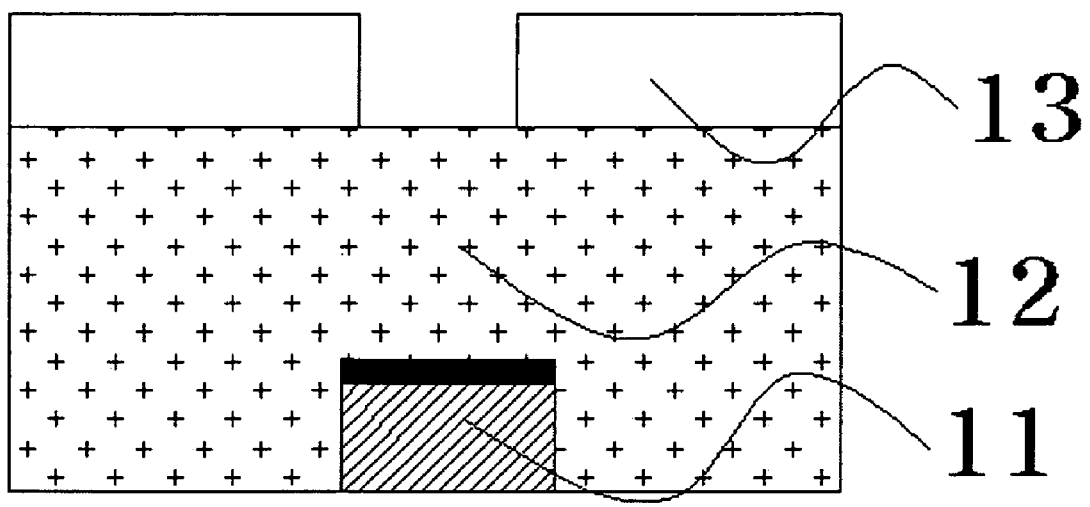
FIGS. 2a through 2e are cross-sectional views illustrating an example process for forming a via hole in a semiconductor device in accordance with the teachings of the present invention.
Figure 2B:
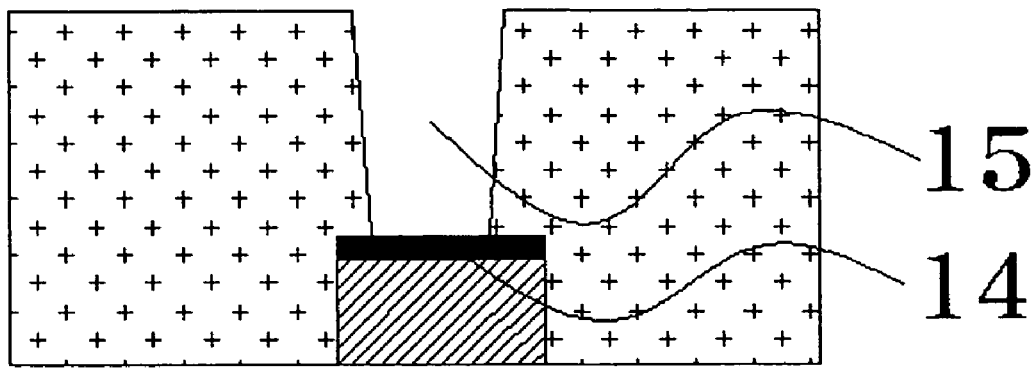

FIGS. 2a through 2e are cross-sectional views illustrating an example process for forming a via hole in a semiconductor device. Referring to FIGS. 2a and 2b, a TiN layer 14 is formed on a metal layer 11. An insulating layer 12 is then deposited over the TiN layer 14 and the metal layer 11. A photoresist pattern 13 is then formed on the insulating layer 12 to form a via hole.

Referring to FIG. 2b, a via hole 15 is formed by etching the insulating layer 12 until the TiN layer 14 on the metal layer 11 is exposed. The etching process (e.g., an anisotropic etching using plasma) is performed on the insulating layer 12 while using the TiN layer 14 as an etch-stop layer. The diameter of the via hole 15 varies with the anisotropic etching depth. In the illustrated example, the diameter of the via hole 15 is in inverse proportion to the etching depth.

Figure 2C:
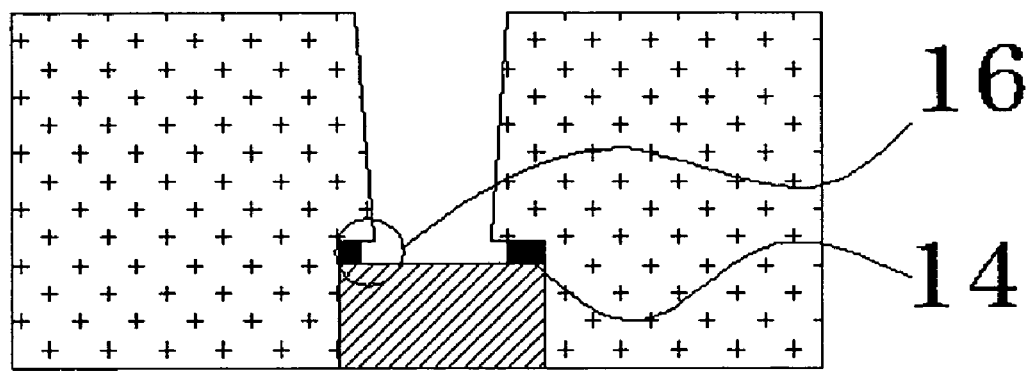

Referring to FIG. 2c, the exposed TiN layer 14 is isotropically etched with plasma. The portions of the TiN layer 14 in the corners 16 of the cross-sectional view of the hole 15 (i.e., the areas under and adjacent the bottom perimeter of the hole 15) are removed by the isotropic etching. Therefore, the diameter of the lower part of the via hole 15 is enlarged. In the illustrated example, the enlarged diameter of the lower part of the via hole 15 is at least equal to or greater than that the diameter of the upper part of the via hole 15.

A conventional plasma etching apparatus can be used to perform the isotropic etching. Alternatively, a plasma ashing apparatus which uses etching gases such as oxygen or fluorine can be employed to perform the isotropic etching. To prevent over-etching of the TiN layer 14, the isotropic etching is preferably performed for a length of time between approximately 10 seconds and approximately 40 seconds.

Figure 2D:
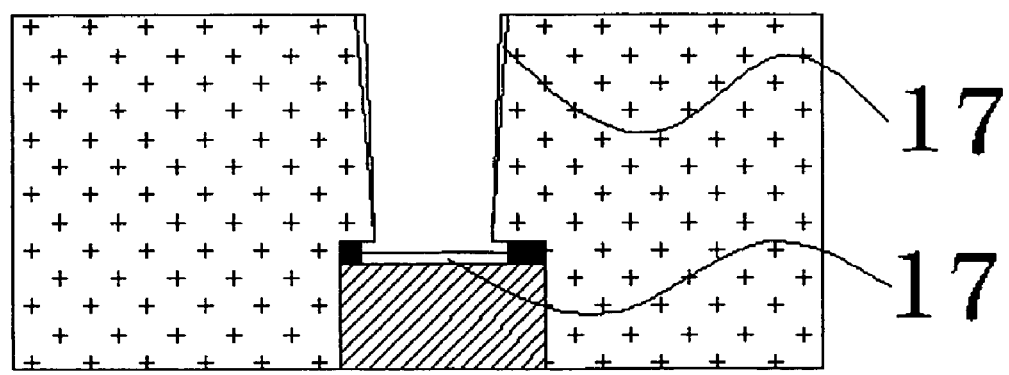
Figure 2E:
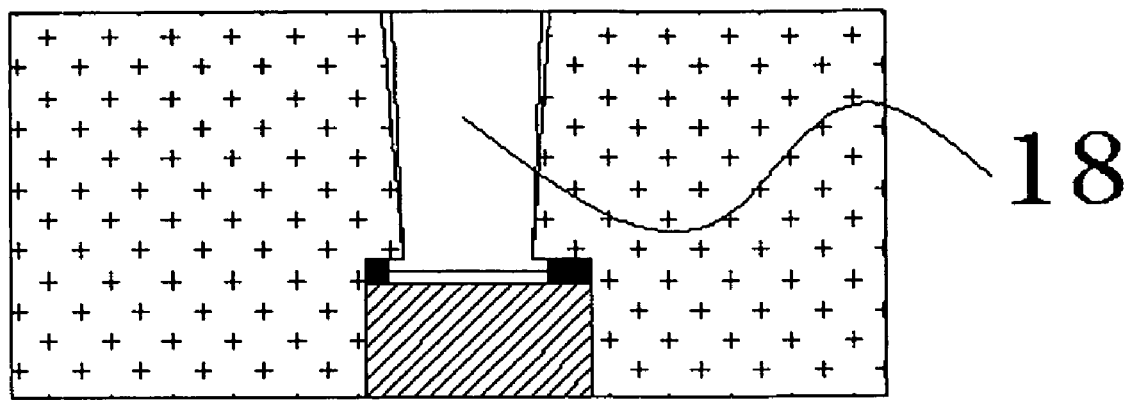

In the example shown to FIG. 2d, a barrier metal layer 17 is deposited on the inside of the via hole 15 and on the exposed portion of the metal layer 11. As shown in FIG. 2e, the illustrated via hole 15 is then filled with a metallic material 18.

Figure 2F:
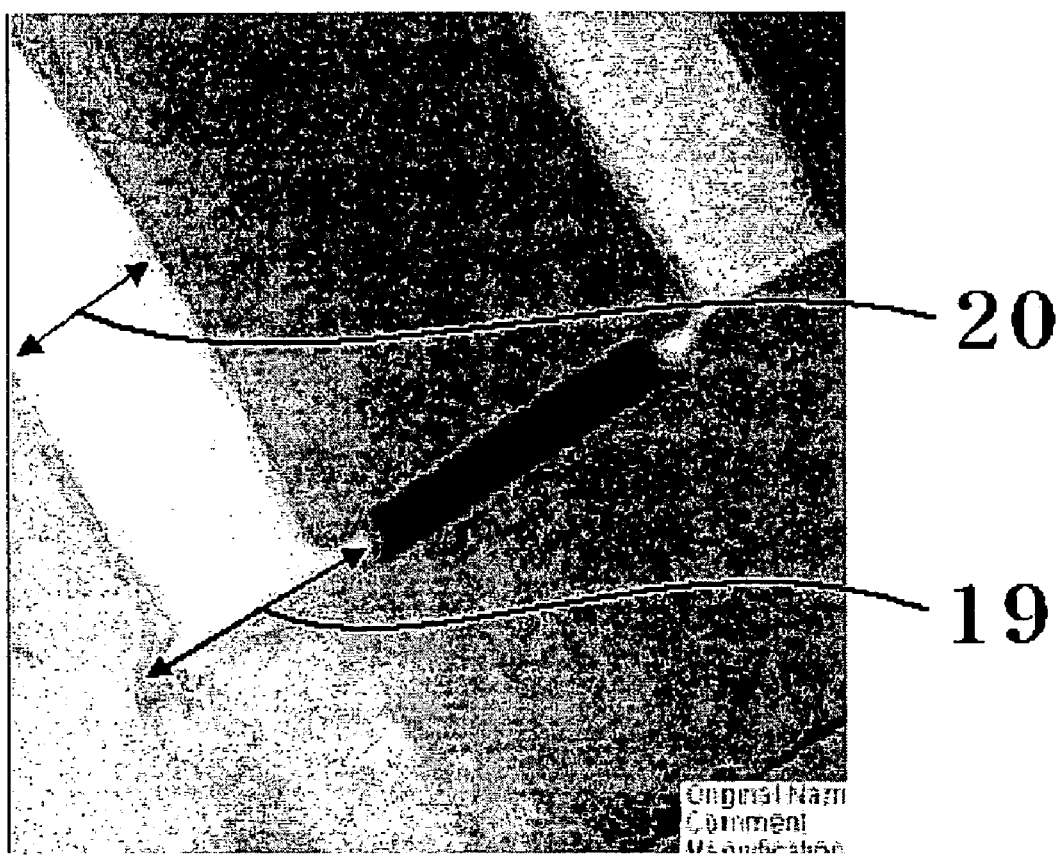
FIG. 2f is a cross-sectional view of an example via hole constructed pursuant to the process illustrated in FIGS. 2a through 2e as seen through a SEM.

FIG. 2f is a cross-sectional view of an example via hole fabricated using the example process illustrated in FIGS. 2a-2f as seen through an SEM. As shown in FIG. 2f, the diameter 19 of the lower part of the via hole is larger than the diameter 20 of the upper part of the via hole. In the illustrated example, the diameter 19 of the lowest part of the via hole is larger than the diameter of the next lowest portion of the hole such that the bottom portion of the hole flares out in a stepped structure. In other words, an annular channel is formed around the bottom perimeter of the via hole. This annular channel may be at least partially filled with a barrier metal layer 17 and may also be partially filled with the metallic material 18 forming an interconnect.

From the foregoing, persons of ordinary skill in the art will readily appreciate that methods for fabricating a via hole in a semiconductor device have been disclosed. A semiconductor device having a via hole fabricated by such a method may have high operating speed, may have low power requirements, and may experience minimal current loss. These advantages are achieved by increasing the area of the lower part of the via hole through a second etching process of the TiN layer 14 after a first etching process exposes that layer 14. In other words, the area of the lower part of the via hole may be increased by dry-etching an insulating layer 12 until the TiN layer 14 is exposed, and then by slightly etching the exposed TiN layer 14 on a metal layer through an isotropic etching process.

Persons of ordinary skill in the art will recognize that the metal layer 11 may represent a lower metal interconnect in a dual Damascene structure.

From the foregoing, persons of ordinary skill in the art will also appreciate that a disclosed method for forming a via hole in a semiconductor device comprises forming a photoresist pattern on an insulating layer 12, anisotropic etching the insulating layer 12 to form a via hole 15, performing an isotropic etching on a TiN layer at a bottom of the via hole 15, and filling a metallic material 18 into the via hole 15.

In the illustrated example, the insulating layer 12 is deposited on a TiN layer 14 which is located on a metal layer 11. The insulating layer 12 is then dry-etched with plasma to form the via hole 15. The TiN layer 14 on the metal layer 11 is used as an etch-stop layer and is, thus, at least partially exposed by this dry-etching process. A portion of the TiN layer 14 may, thus, be readily removed by isotropic etching. The TiN layer 14 at the bottom perimeter 16 of the via hole 15 is etched by this isotropic etching process such that the diameter of the via hole 15 is enlarged. In the illustrated example, the isotropic etching is performed by a plasma ashing apparatus which employs etching gases including fluorine and oxygen. To prevent over-etching of the TiN layer 14, the isotropic etching is preferably performed for between approximately 10 seconds and approximately 40 seconds. Next, a barrier metal layer 17 is deposited on the inside of the via hole 15 and on the exposed portion of the metal layer 11 within the via hole 15. The via hole 15 is then filled with a metallic material 18 to complete the interconnect.

It is noted that this patent claims priority from Korean Patent Application Serial Number 10-2003-0058157, which was filed on Aug. 22, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a via hole in a semiconductor device comprising:

forming an etch-stop layer on a metal layer;

forming an insulating layer on the etch-stop layer;

anisotropic etching the insulating layer to form a via hole and expose the etch-stop layer on the metal layer;

isotropic etching the exposed etch-stop layer to expose the metal layer and enlarge a diameter of a lowest part of the via hole to be greater than a diameter of an upper part of the via hole;

depositing a barrier metal layer on the insides of the via hole and on the exposed metal layer; and at least partially filling the via hole with a metallic material.

2. The method as defined by claim 1, wherein the etch-stop layer is a TiN layer.

\* \* \* \* \*